(12) United States Patent
Carlson et al.

(10) Patent No.: US 11,901,140 B2
(45) Date of Patent: Feb. 13, 2024

(54) HYBRID CIRCUIT BREAKER WITH SOLID STATE DEVICES

(71) Applicant: ROCKWELL AUTOMATION TECHNOLOGIES, INC., Mayfield Heights, OH (US)

(72) Inventors: Andrew E. Carlson, Franklin, WI (US); Kyle B. Adkins, Oak Creek, WI (US); Randall S. Langer, Oak Creek, WI (US); David Elmiger, Hitzkirch (CH); Aiman Kerim, Aarau (CH); James P. Miller, Waterford, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 17/745,421

(22) Filed: May 16, 2022

(65) Prior Publication Data

US 2023/0368990 A1    Nov. 16, 2023

(51) Int. Cl.
*H01H 33/04*     (2006.01)
*H01H 50/16*     (2006.01)
*H03K 17/56*     (2006.01)

(52) U.S. Cl.
CPC ............ *H01H 33/04* (2013.01); *H01H 50/16* (2013.01); *H03K 17/56* (2013.01)

(58) Field of Classification Search
CPC .... H01H 33/04; H01H 33/022; H01H 33/593; H01H 9/56; H01H 9/541; H01H 9/542; H01H 9/547; H01H 9/548; H01H 9/167; H01H 2009/543–546; H01H 47/20; H03K 17/56

(Continued)

(56) References Cited

U.S. PATENT DOCUMENTS 6,023,418 A * 2/2000 Engira ................ H02M 1/10
                                                363/63
7,405,910 B2   7/2008 Maitra et al.
(Continued)

FOREIGN PATENT DOCUMENTS

AU   2019416218 A1   7/2021

OTHER PUBLICATIONS

Extended European Search Report for EP Application No. 23172286.9, dated Oct. 10, 2023, 8 Pages.

*Primary Examiner* — William A Bolton
(74) *Attorney, Agent, or Firm* — Fletcher Yoder, P.C.

(57) ABSTRACT

This disclosure describes a hybrid circuit breaker for an industrial automation system. The hybrid circuit breaker may include a mechanical switch and solid-state switches. The hybrid circuit breaker may receive control signals to open and close a current path based on moving a spanner of the mechanical switch. In some cases, moving the spanner of the mechanical switch may generate electrical arcs when the hybrid circuit breaker is conducting electrical current. In such cases, the hybrid circuit breaker may remove the electrical arcs by drawing the electrical arcs to a conductive bar and away from the spanner. Moreover, the hybrid circuit breaker may dissipate the electrical arcs on the conductive bar by opening one or multiple solid-state switches disposed on the conductive bar. In some cases, one or multiple voltage suppressors may receive (e.g., suppress or ground) an electrical power of the electrical arcs when the solid-state switches are opened.

20 Claims, 8 Drawing Sheets

(58) Field of Classification Search
USPC ........... 218/3; 361/2, 8, 84, 91.1, 93.1, 93.5, 361/91.5–91.8, 13; 307/130; 327/365
See application file for complete search history.

(56) References Cited

U.S. PATENT DOCUMENTS

| | | | |
|---|---|---|---|
| 7,508,636 B2 | 3/2009 | Sellier et al. | |
| 8,503,138 B2* | 8/2013 | Demetriades | H01H 9/542 |
| | | | 361/11 |
| 8,638,531 B2* | 1/2014 | Bhavaraju | H01H 50/045 |
| | | | 361/8 |
| 8,742,767 B2 | 6/2014 | Messersmith et al. | |
| 8,928,185 B2* | 1/2015 | Greither | H03K 17/6871 |
| | | | 307/113 |
| 8,958,193 B2* | 2/2015 | Veliadis | H02H 1/0023 |
| | | | 327/430 |
| 9,508,500 B2 | 11/2016 | Reymond et al. | |
| 9,722,513 B2* | 8/2017 | Bock | H01H 9/563 |
| 9,880,223 B2 | 1/2018 | Messersmith et al. | |
| 10,276,321 B2 | 4/2019 | Kennedy et al. | |
| 10,541,530 B2 | 1/2020 | Kennedy et al. | |
| 10,630,069 B2 | 4/2020 | Kennedy et al. | |
| 10,784,061 B2 | 9/2020 | Kennedy et al. | |
| 10,804,692 B2 | 10/2020 | Kennedy et al. | |
| 10,811,867 B2 | 10/2020 | Kennedy et al. | |
| 10,896,790 B2 | 1/2021 | Kennedy et al. | |
| 10,896,791 B2 | 1/2021 | Kennedy et al. | |
| 11,037,749 B2 | 6/2021 | Kouroussis et al. | |
| 11,158,477 B2 | 10/2021 | Mazur et al. | |
| 2013/0099566 A1* | 4/2013 | Pfitzer | H02J 3/14 |
| | | | 307/115 |
| 2020/0106260 A1* | 4/2020 | Telefus | H02H 3/10 |
| 2020/0395739 A1 | 12/2020 | Santore et al. | |
| 2020/0395748 A1 | 12/2020 | Miller et al. | |
| 2021/0066013 A1 | 3/2021 | Kumar et al. | |
| 2021/0098216 A1 | 4/2021 | Omari et al. | |
| 2021/0126447 A1 | 4/2021 | Miller | |
| 2021/0226437 A1* | 7/2021 | Lichauer | H02H 7/262 |
| 2021/0241989 A1 | 8/2021 | Kouroussis et al. | |
| 2021/0265830 A1 | 8/2021 | Mazur et al. | |
| 2022/0091585 A1* | 3/2022 | Watkins | G05B 19/0428 |
| 2022/0115859 A1* | 4/2022 | Zhou | H01H 9/38 |

\* cited by examiner

HYBRID CIRCUIT BREAKER WITH SOLID STATE DEVICES

BACKGROUND

This disclosure relates generally to systems and methods for circuit breakers used within industrial automation systems. More specifically, the present disclosure discusses mechanical and solid-state circuit breakers, which may be used to protect a portion of an industrial automation system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

An industrial automation system may include a variety of components associated with different types of motors and motor-drive configurations. For example, different motor-drive configurations may use different types of protection and electrical isolation systems to protect various electrical components connected to a motor-drive system from certain overvoltage and/or overcurrent situations. To effectively protect and operate a variety of types of motors and electrical systems in an industrial automation system, circuit breakers may be included between an electrical load (e.g., a motor) and a power supply.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In an embodiment, a circuit breaker is described. The circuit breaker may include a first conductor that may move between a first position and a second position. The first position may correspond to a second conductor being coupled to a third conductor via the first conductor. Moreover, the second position may correspond to the second conductor uncoupling from the third conductor via the first conductor. The circuit breaker may also include a fourth conductor comprising solid-state switching circuitry. The fourth conductor may receive an arc current after the first conductor moves from the first position to the second position. The solid-state switching circuitry may open after the first conductor moves from the first position to the second position.

In another embodiment, a method is described. The method may include receiving an indication to open a conductive path of a circuit breaker by a processor. The conductive path may include a first conductor, a second conductor, and a spanner. The method may also include transmitting a first signal to a mechanical switch system of the circuit breaker in response to receiving the indication by the processor. The mechanical switch system may move the spanner in response to receiving the first signal. Moreover, the spanner is positioned a first distance away from the first conductor and the second spanner after the spanner is moved. The method may further include transmitting a second signal to one or more solid-state switches of the circuit breaker by the processor. The one or more solid-state switches may open in response to receiving the second signal. The one or more solid-state switches may be coupled to a conductive bar separate from the spanner and positioned a second distance away from the first conductor.

In another embodiment, a tangible, non-transitory, machine-readable medium, including machine-readable instructions that, when executed by a processor, cause the processor to perform actions is described. The actions may include receiving an indication to open a conductive path of a circuit breaker. The conductive path may include a first conductor, a second conductor, and a spanner. The actions may also include transmitting a first signal to a mechanical switch system of the circuit breaker in response to receiving the indication. The mechanical switch system may move the spanner in response to receiving the first signal. The spanner is positioned a first distance away from the first conductor and the second conductor after the spanner is moved. The actions may further include transmitting a second signal to one or more solid-state switches of the circuit breaker. The one or more solid-state switches may open in response to receiving the second signal. The one or more solid-state switches are coupled to a conductive bar separate from the spanner. Moreover, the conductive bar is positioned a second distance away from the first conductor. The first distance may be different from the second distance.

DRAWINGS

These and other features, aspects, and advantages of the present disclosure will become better understood when the following detailed description is read with reference to the accompanying drawings in which like characters represent like parts throughout the drawings, wherein.

Figure 2:
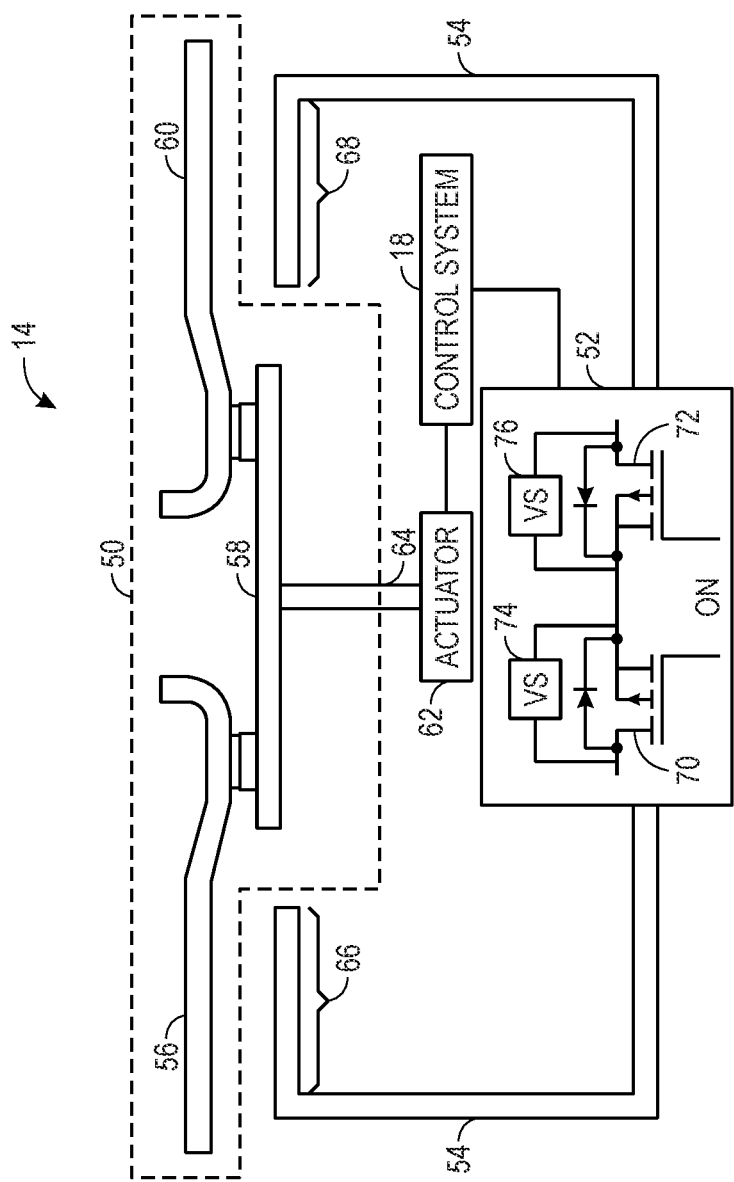
FIG. 2 is a an embodiment of the hybrid circuit breaker of the feeder system of FIG. 1, in accordance with embodiments described herein.
Figure 3:
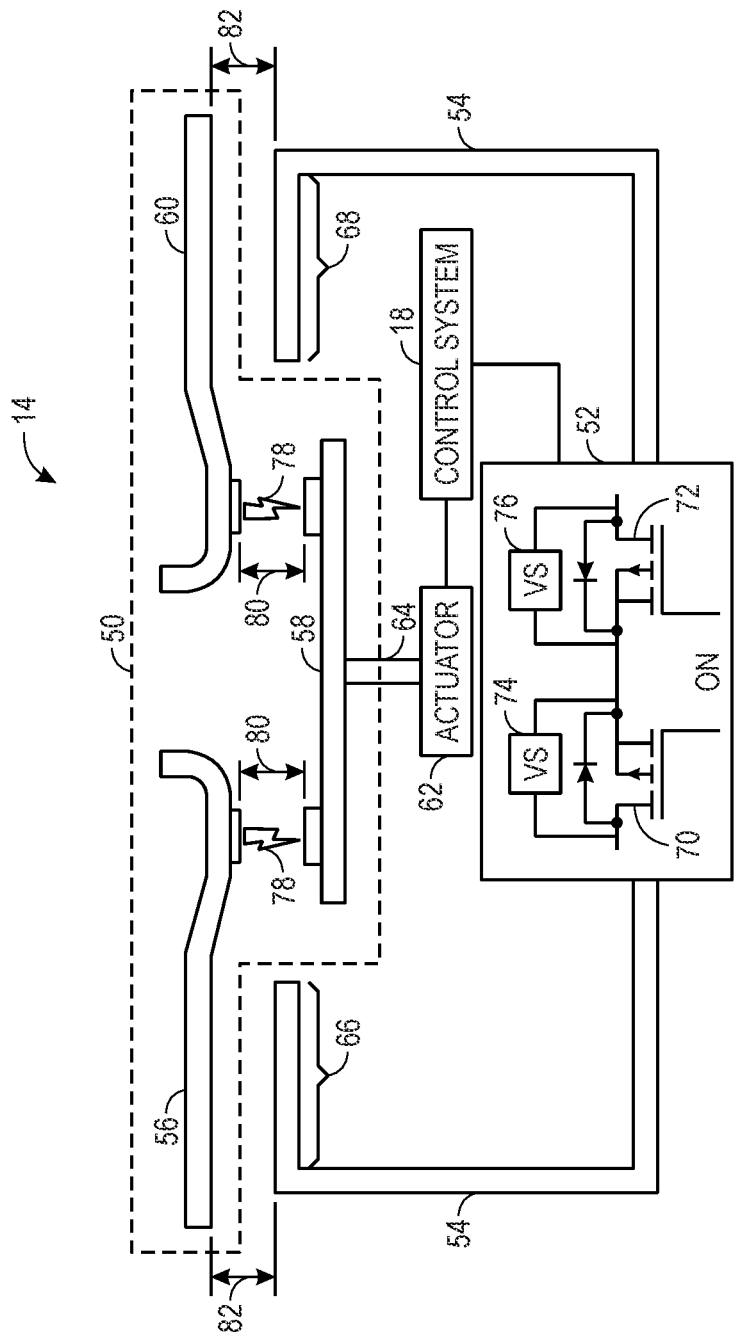
Figure 4:
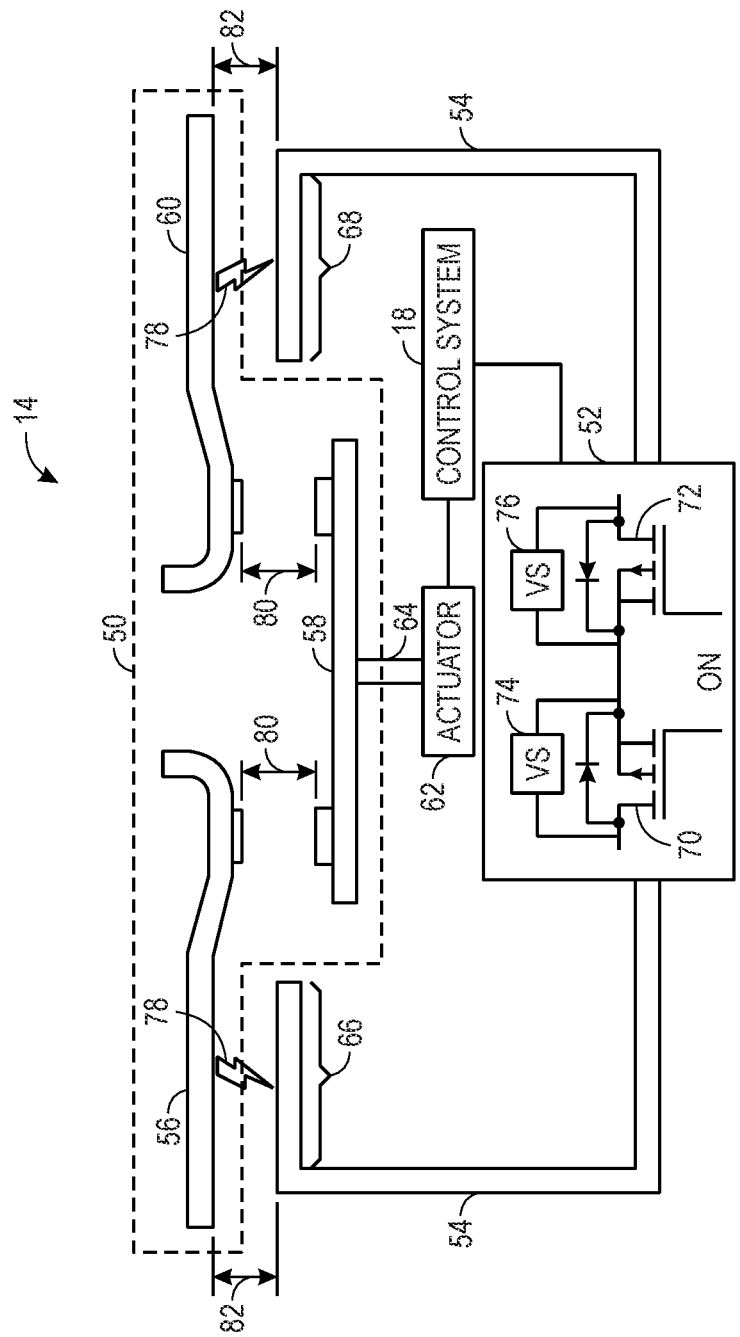
Figure 5:
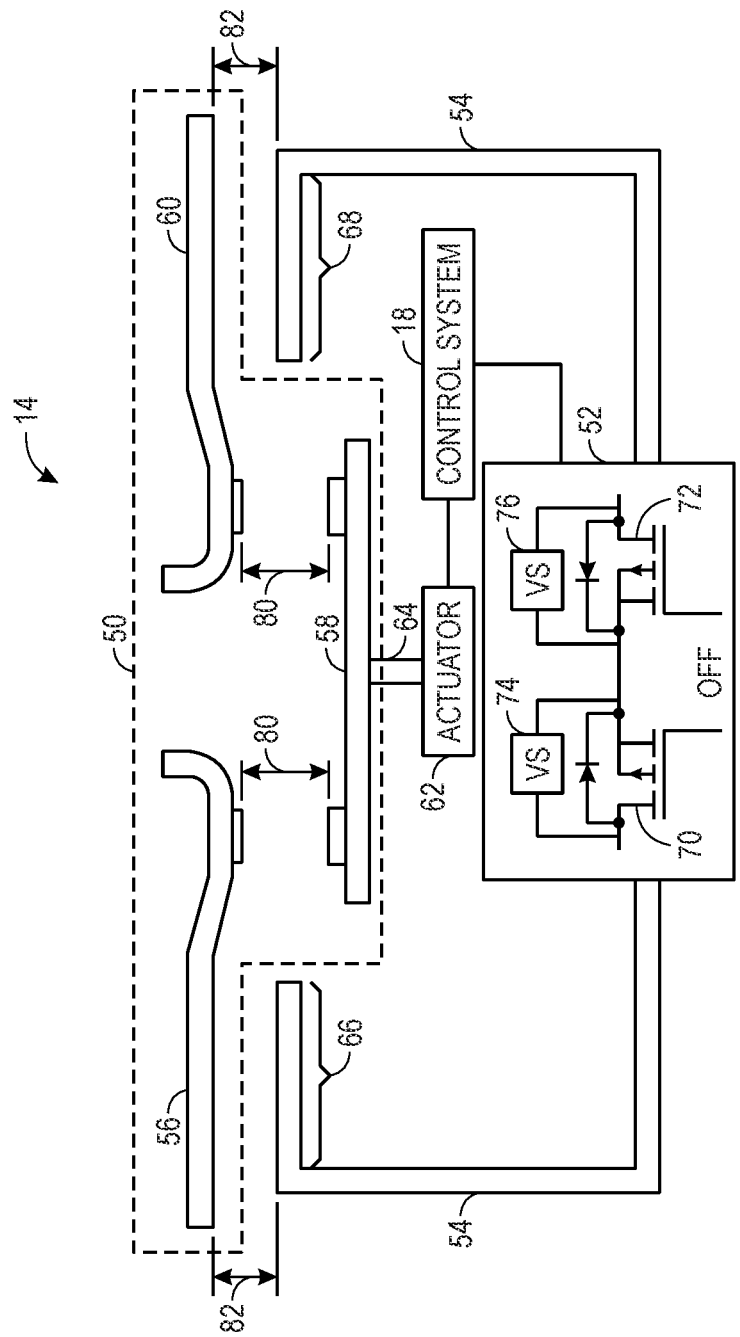
Figure 6:
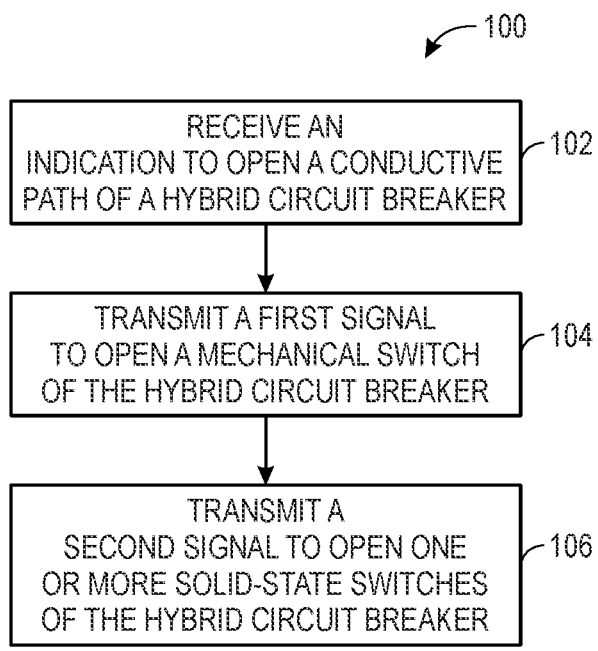
Figure 7:
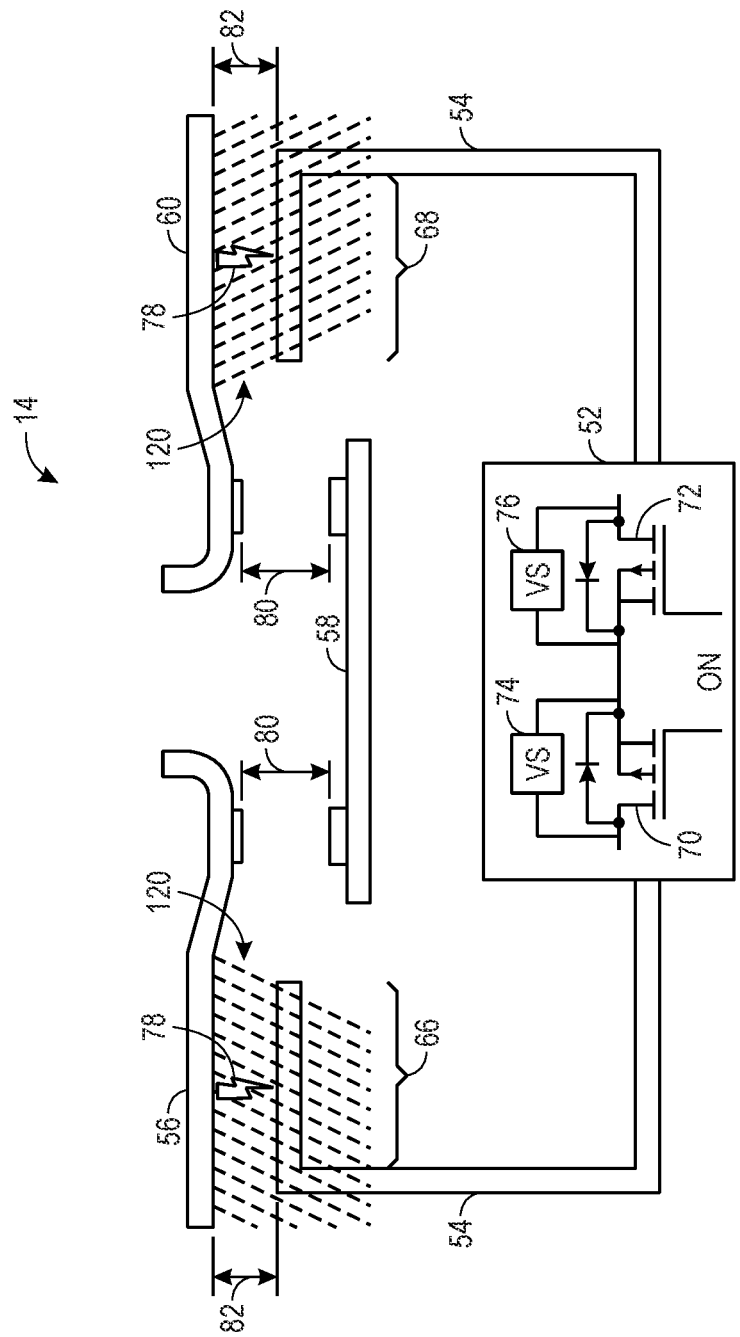
Figure 8:
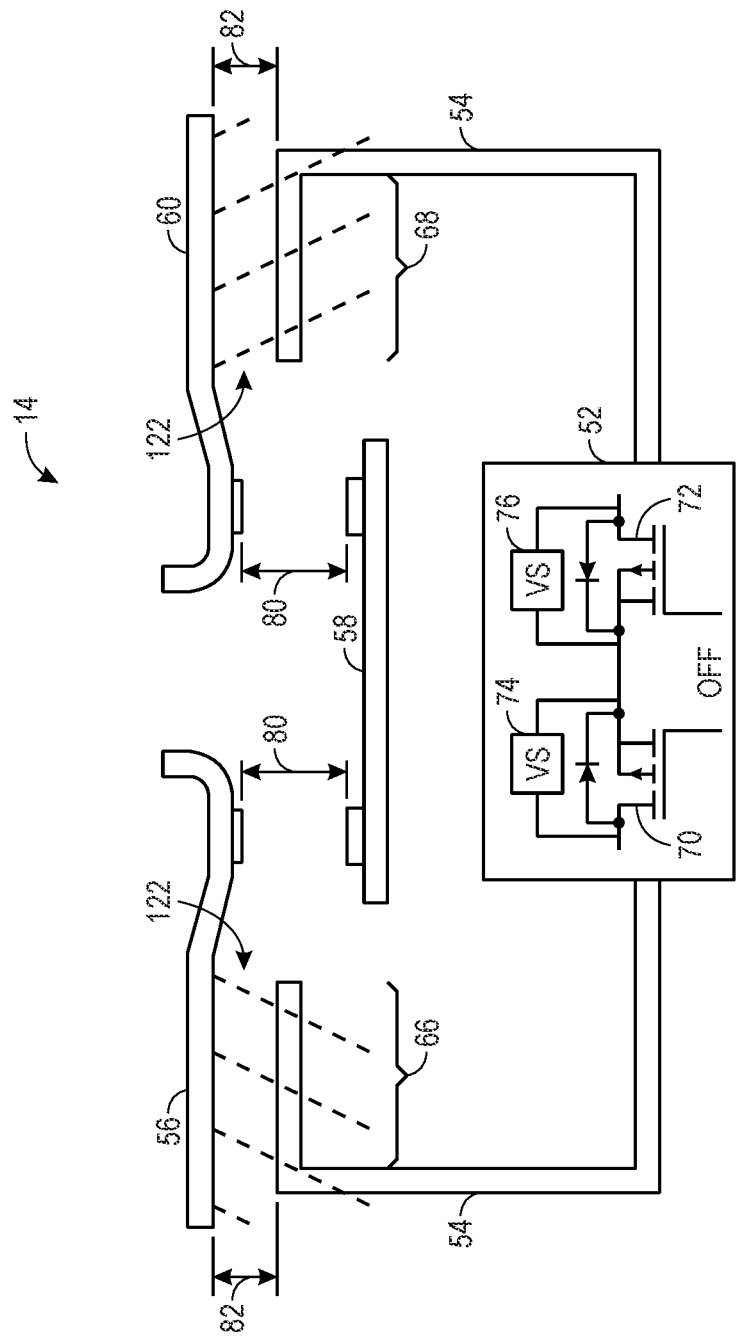

FIG. 3 presents the hybrid circuit breaker of FIG. 2 when opening a conductive path through the hybrid circuit breaker, in accordance with embodiments described herein;

FIG. 4 presents the hybrid circuit breaker of FIG. 3 when a solid-state switching circuit of the hybrid circuit breaker may have electrical arcs present when opening the conductive path, in accordance with embodiments described herein;

FIG. 5 presents the hybrid circuit breaker of FIG. 4 after the solid-state switching circuit suppressed the electrical arcs of the hybrid circuit breaker, in accordance with embodiments described herein;

FIG. 6 is a flowchart of a process for providing a first signal to the hybrid circuit breaker of FIG. 2 to open the conductive path and suppress any present electrical arcs, in accordance with embodiments described herein FIG. 7 is a perspective view of the hybrid circuit breaker of FIG. 2 illustrating a heat flux map of the electrical arcs, in accordance with embodiments described herein; and FIG. 8 is a perspective view of the hybrid circuit breaker of FIG. 2 illustrating dissipated heat after the solid-state switching circuit suppressed the electrical arcs of the hybrid circuit breaker, in accordance with embodiments described herein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. As used herein, "in-line" refers to a longitudinal axis of a drive module or a component of a drive module arranged parallel with a rotational axis of a rotor of a motor. As used herein, "potting" refers to covering electronic components (e.g., circuitry) and/or filling an assembly containing electronic components with a solid or gelatinous material to prevent adverse environmental factors (e.g., water, moisture, corrosion, and so forth) and/or adverse effects from physical forces (e.g., impacts, shocks, vibrations, and so forth). As used herein, "power conversion" refers to converting alternating current into direct current, converting direct current into alternating current, altering a voltage of a current, or altering a frequency of a current, or any combination thereof.

The current disclosure is related to a hybrid circuit breaker including a mechanical switch and a solid-state switching circuit. The mechanical switch may include an input conductor, an output conductor, and a spanner (e.g., contactor). The input conductor may couple to and uncouple from the output conductor based on a position of the spanner. The spanner may move to a first position or a second position to couple and uncouple the input conductor and the output conductor, respectively. In some cases, an actuator, a magnet, or other suitable device connected to the spanner may receive one or more control signals (e.g., from a controller) to cause the spanner to move to the first position or the second position.

In particular, the spanner may move to the first position connecting the input conductor and the output conductor to provide a current path between the two conductors. As such, electrical current may flow through the current path of the hybrid circuit breaker when the spanner is at the first position. Moreover, the spanner may move to the second position to open the current path by uncoupling the input conductor and the output conductor. For example, the spanner may provide galvanic isolation by moving to the second position, thereby providing a gap (e.g., an air gap) between the input conductor, the output conductor, and the spanner. Accordingly, moving the spanner to the second position may halt the electrical current flow through the hybrid circuit breaker.

In some cases, when electrical current is flowing through the hybrid circuit breaker, moving the spanner from the first position to the second position may create an electrical arc between the spanner and the input conductor and/or the output conductor. Arc current of the electrical arc may damage the spanner and/or other elements of the hybrid circuit breaker. In such cases, a conductive bar (e.g., a commutation bar, a substitution bar) may be positioned within the hybrid circuit in such a manner to draw the electrical arc (e.g., the arc current of the electrical arc) away from the spanner to reduce or prevent such damages, as will be appreciated.

The conductive bar may be positioned separately from the spanner and may include a solid-state switching circuit disposed thereon. The solid-state switching circuit may include a number of solid-state switches to close or open a conductive path between the first side and the second side of the conductive bar. A first side of the conductive bar may be positioned within a certain proximity or distance of the input conductor and a second side of the conductive bar may be positioned within a certain proximity or distance of the output conductor.

With the foregoing in mind, the conductive bar may be positioned such that when the spanner is at the second positon, the gap between the input conductor and the spanner is greater (e.g., wider) than a gap between the input conductor and the first side of the conductive bar. As such, the conductive bar may draw the electrical arc current that was previously present between the input conductor and the spanner after the spanner moves from the first position to the second position. For example, the conductive bar may cause the electrical arc current to conduct away from the spanner based on plasma physics principles and magnetic forces present between the input conductor and the spanner moved to the second position as compared to the same properties present between the input conductor and the conductive bar at the same time.

Similarly, when the spanner is at the second positon, the gap between the output conductor and the spanner is greater than a gap between the output conductor and the second side of the conductive bar. Accordingly, the conductive bar may draw the electrical arc current between the output conductor and the spanner after the spanner moves from the first position to the second position.

After the electrical arc current moves to the conductive bar, the solid-state switching circuit may conduct the electrical arc current in one direction. In some cases, the solid-state switching circuit may include a first solid-state switch that may provide a first directional current path between the first side of the conductive bar to the second side of the conductive bar. Moreover, the solid-state switching circuit may include a second solid-state switch to provide a second directional current path between the second side of the conductive bar to the first side of the conductive bar.

By way of operation, the first solid-state switch and the second solid-state switch may be closed as the spanner is moving from the first position to the second position. Accordingly, the conductive bar may receive (e.g., absorb) one or more electrical arcs as the gap between the spanner and the input conductor and/or the output conductor becomes greater than the gap between the conductive bar and the input conductor and/or the output conductor. Subsequently, the first solid-state switch, the second solid-state switch, or both, may open as the conductive bar receives the electrical arc. Accordingly, the conductive bar may suppress the electrical arc current when the first solid-state switch, the second solid-state switch, or both, open to break the conductive paths available to the electrical arc current. In some cases, the solid-state switching circuit may also include one or more voltage suppressors to discharge the electrical arc currents.

In some cases, the first switch, the second switch, or both may open in response to receiving one or more control signals when the spanner moves from the first position to the second position. For example, the controller may transmit the one or more signals to open the first switch, the second switch, or both, based on a time threshold after transmitting the one or more control signals to move the spanner from the first position to the second position, based on the spanner reaching the second position, based on the gaps associated with the spanner becoming wider than gaps associated with the conductive bar, among other possibilities.

The conductive bar may reduce or prevent damages of the one or more electrical arcs to the spanner based on discharging the electrical arc current. Moreover, discharging the electrical arc current may dissipate heat that may otherwise be present based on the electrical arc current. The heat may also reduce a lifespan of the spanner and therefore the hybrid circuit breaker. Accordingly, the conductive bar may increase a lifespan of the spanner and the hybrid circuit breaker.

Figure 1:
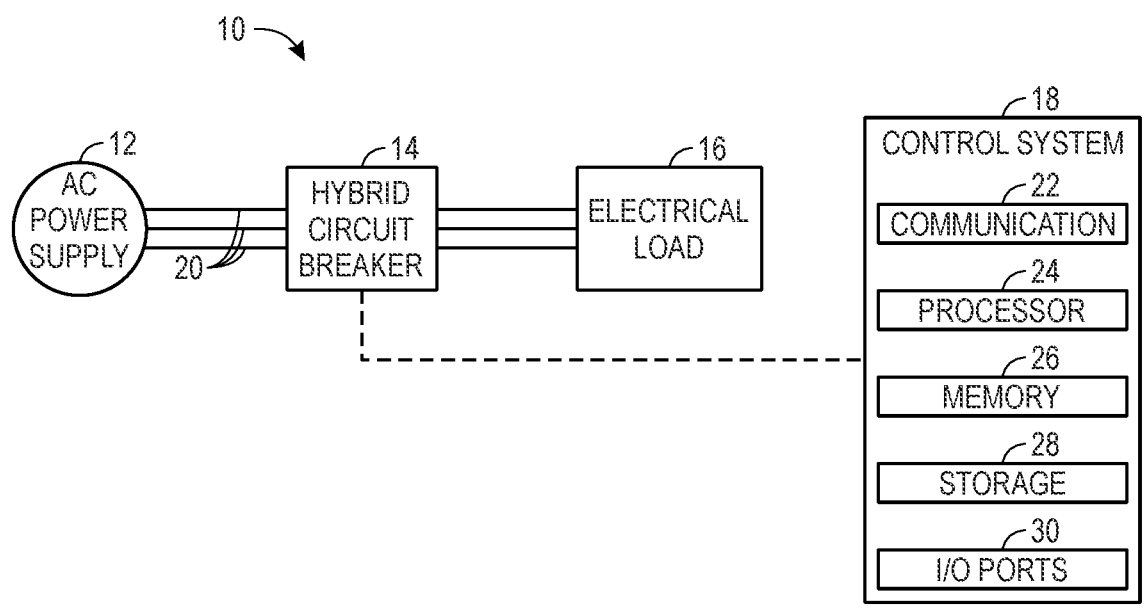
FIG. 1 is a block diagram of a feeder system including a hybrid circuit breaker that may be part of an industrial automation system, in accordance with embodiments described herein.

By way of introduction, FIG. 1 is a block diagram of a feeder system 10 (e.g., motor feeder system, motor control center (MCC) feeder system), which may be part of an industrial automation system. The feeder system 10 may include a power supply, such as an alternating current (AC) power supply 12, to supply power to loads coupled downstream. The feeder system may also include a hybrid circuit breaker 14 coupled to the AC power supply 12. The AC power supply 12 may supply current and/or voltage to an electrical load 16 coupled to the hybrid circuit breaker 14.

In some cases, when abnormal operation occurs, such as when a voltage that is uncharacteristically high or low is delivered to the electrical load 16, the hybrid circuit breaker 14 may electronically disconnect the AC power supply 12 from the electrical load 16. As such, the hybrid circuit breaker 14 may protect the electrical load from supply voltages and/or supply currents that may damage the hybrid circuit breaker 14.

Any suitable number of supply devices may be represented by the AC power supply 12, such as any combination of rectifiers, converters, power banks, generation devices, or the like. It should be understood that the feeder system 10 may include one or more motor-drive systems, motors, MCCs, or the like as the electrical load, coupled between any of the depicted devices and that the feeder system 10 may include one or more additional components not depicted in FIG. 1.

For example, the feeder system 10 may include any suitable type of rectifier device that includes a number of switches controllable by any suitable power converter. For example, the AC power supply 12 may include an active front end (AFE) converter, a diode converter, a thyristor converter, a diode front end rectifier, or the like. In some embodiments, the switches of the AC power supply 12 may be semiconductor-controlled devices, transistor-based (e.g., insulated-gate bipolar transistor (IGBT), metal-oxide semiconductor field-effect transistor (MOSFET), or other suitable transistor) devices, or other suitable devices in which the opening and/or closing of the switch may be controlled using an external signal (e.g., gate signal), which may be provided by the control system 18. The AC power supply 12 may provide AC supply signals (e.g., AC voltage, AC current, a regulated AC output) on a bus 20, which may be provided to the hybrid circuit breaker 14. In some cases, the bus 20 may include three transmission lines for providing each phase of a three-phased electrical power to the electrical load 16 via a dedicated hybrid circuit breaker 14.

It is noted that the feeder system 10 may be used in a variety of industrial automation systems, such as food manufacturing, industrial operations systems, refineries, or the like. In this way, implementation and use of the hybrid circuit breaker 14 to protect various electrical loads may improve operations of industrial automation systems. For example, the hybrid circuit breaker 14 may include mechanical switch and solid-state switching circuit. The hybrid circuit breaker 14 may use the solid-state switching circuit to draw one or more electrical arcs away from the mechanical switch when electronically disconnecting the AC power supply 12 from the electrical load 16. The solid-state switching circuit may then extinguish (e.g., suppress) the electrical arcs using solid-state switches. Accordingly, the hybrid circuit breaker 14 may reduce or eliminate an adverse effect of the electrical arcs on the mechanical switch (or the hybrid circuit breaker 14) and improve (e.g., increase) reliability and lifespans of systems using hybrid circuit breakers 14.

Industrial automation systems may operate in response to signals generated by the control system 18. The control system 18 may include any suitable number of electronic devices and/or components to generate and/or manage generation of the control signals. For example, the control system 18 may include a communication component 22, a processor 24, a memory 26, storage 28, and input/output (I/O) ports 30, or the like, for generating and managing generation of control signals.

The communication component 22 may be a wireless or wired communication component that facilitates communication between the control system 18, the hybrid circuit breaker 14, or other suitable electronic devices. The processor 24 may be any type of computer processor or microprocessor capable of executing computer-executable code. The memory 26 and the storage 28 may be any suitable articles of manufacture that may serve as media to store processor-executable code, data, or the like. These articles of manufacture may represent computer-readable media (i.e., any suitable form of memory or storage) that may store the processor-executable code used by the processor 24 to perform the presently disclosed techniques, such as to predictively respond to operational changes, or the like.

The I/O ports 30 may couple to one or more sensors, one or more input devices, one or more displays, or the like, to facilitate human or machine interaction with the control system 18, the hybrid circuit breaker 14, or other suitable electronic devices. For example, based on a notification provided to the operator via a display, the operator may use an input device to instruct the adjustment of a parameter associated with the hybrid circuit breaker 14.

Keeping the foregoing in mind, sometimes the control system 18 may communicate with the hybrid circuit breaker 14 using one or more communication techniques. For example, the hybrid circuit breaker 14 may include a controller area network (CAN) communicative coupling and/or an internet protocol (IP)-based communicative coupling, such as an Ethernet IP communicative coupling, to the control system 18. These communicative couplings may enable the hybrid circuit breaker 14 to communicate with the control system 18 without intervention from a host computer. Thus, the hybrid circuit breaker 14 may communicate directly with the control system 18 without using an intervening computing device.

In some cases, the control system 18 may use one or more configuration interfaces to communicate with the hybrid circuit breaker 14. The configuration interface may be a graphical user interface and/or logically-defined data object (e.g., data table) that permits the control system 18 and/or user to provide and/or update a configuration and/or to obtain a status of the hybrid circuit breaker 14. In this way, the configuration interface may be a data boundary used to translate configurations from devices external to the hybrid circuit breaker 14 to a format readable by the hybrid circuit breaker 14 and/or to translate statuses from the hybrid circuit breaker 14 into a format readable by devices external to the hybrid circuit breaker 14.

The control system 18 may also permit configuration of properties of the hybrid circuit breaker 14 based at least in part on thermal measurements and/or metering information, such as phase-phase voltages, phase-to-ground voltages, input current, output current, frequency, power, status of the hybrid circuit breaker 14 (e.g., Open Close, Blocked, Failure), or the like. In this way, the control system 18 may determine a current operation of the hybrid circuit breaker 14 and use the information of the current operation to determine how to adjust an operation of the hybrid circuit breaker 14. For example, the control system 18 may determine that the hybrid circuit breaker 14 is blocked and has a thermal measurement higher than a historical average for the hybrid circuit breaker 14. Using this information, the control system 18 may determine that an undesired operation is occurring, and thus may determine to open the hybrid circuit breaker 14. Furthermore, the control system 18 may use this information to operation other devices upstream and/or downstream of the hybrid circuit breaker 14, such as controlling additional protection circuitry to further isolate the hybrid circuit breaker 14 from the industrial automation system.

The properties, in some embodiments, may also be used to define operation limits corresponding to determined settings to be used to protect the load. The operation limits may correspond to operating ranges set by governing agencies or standard committees, such as American National Standards Institute (ANSI®), Underwriters Laboratories (UL®), International Electrotechnical Commission (IEC®) or the like, and may be used to protect the hybrid circuit breaker 14, the electrical load 16, or the like from undesired operating conditions. Furthermore, the properties may also define protection groups or classes associated with the hybrid circuit breaker 14. Protection groups or classes may correspond to groups of electrical loads 16 that may have a same protection scheme. These protection groups or classes may be classifications of types of protection for different devices set by governing agencies or standard committees.

When the electrical load 16 is classified as part of a protection group with another electrical load 16, it may be desired to protect both electrical loads 16 with a hybrid circuit breaker 14 set to the same settings. In this way, when a different electrical load 16 is installed to the hybrid circuit breaker 14, the protection groups or classes may be updated to indicate the new group or class of the new electrical load 16. This may cause the hybrid circuit breaker 14 to automatically update its operational settings to accommodate the new electrical load 16. Use of properties may thus improve deployment of setting changes to the hybrid circuit breakers 14 by making an overall installation process of a new electrical load 16 relatively faster since less time is spent updating operational settings of the hybrid circuit breaker 14.

In some embodiments, the hybrid circuit breaker 14 may detect a protection group or class of its electrical load 16 automatically and/or without receiving the property from the control system 18. In these cases, the hybrid circuit breaker 14 may sense metering information (e.g., operational properties) of the electrical load 16 to determine what protection group or class applies to the electrical load 16. For example, the hybrid circuit breaker 14 may determine that it outputs single-phase power and that its load is operating at a relatively high voltage that corresponds to an operating voltage of a large motor load, thus the hybrid circuit breaker 14 may automatically classify its electrical load 16 as a large motor based on this analysis. For example, a dedicated hybrid circuit breaker 14 may couple to each of the three transmission lines of the bus 20 to open or short a connection of a respective phase of the three-phased power between the AC power supply 12 and the electrical load 16.

FIG. 2 depicts an embodiment of the hybrid circuit breaker 14 in accordance with embodiments as described herein. The hybrid circuit breaker 14 may include a mechanical switch system 50 and a solid-state switching circuit 52 disposed on a commutation bar 54 (e.g., a conductive bar, a commutation bar, among other things). The mechanical switch system 50 may include an input conductor 56, a spanner 58, and an output conductor 60. The spanner 58 may move between two positions to couple the input conductor 56 and the output conductor 60 or uncouple the input conductor 56 and the output conductor 60. In particular, the spanner 58 may couple to the input conductor 56 and the output conductor 60 to provide a current path through the hybrid circuit breaker 14. Moreover, the spanner 58 may uncouple the input conductor 56 from the output conductor 60 to open the current path through the hybrid circuit breaker 14.

The hybrid circuit breaker 14 may include an actuator 62 that may be coupled to the spanner 58 and may cause the spanner 58 to move by extending or retracting an arm 64. The arm 64 may thus be coupled to the actuator 62 to the spanner 58. The actuator 62 may extend and retract the arm 64 based on receiving one or more control signals from the control system 18. For example, the actuator 62 may retract the arm 64 (e., vertically) such that the spanner 58 disconnects from the input conductor 56 and the output conductor 60. Alternatively or additionally, in some embodiments, the actuator 62 may move the conductor 58 at an angle. For example, the actuator 62 may retract the arm 64 at the angle such that the spanner 58 disconnects from the input conductor 56 or the output conductor 60 (e.g., one side/contact of the spanner 58 opens/breaks). In some cases, the actuator 62 may include a solenoid causing the spanner 58 to move by extending or retracting an arm 64. However, the actuator 62 may include any additional or different suitable motor that may move the spanner 58 by way of the arm 64.

A first side 66 and a second side 68 of the commutation bar 54 may be positioned within a threshold distance of the input conductor 56 and the output conductor 60 respectively. Moreover, the commutation bar 54 may be positioned at a threshold distance away from the spanner 58 at the first side 66 and the second side 68. In some cases, the actuator 62 may retract the spanner 58 such that the input conductor 56 becomes closer to the first side 66 of the commutation bar 54 and/or the output conductor 60 becomes closer to the second side 68 of the commutation bar 54 compared to the spanner 58.

In such cases, the commutation bar 54 may receive at least a portion of an electrical arc current generated between the input conductor 56 and the spanner 58 as the spanner 58 moves to the retracted position. That is, the commutation bar 54 may receive the electrical arc current as a gap between the spanner 58 and the input conductor 56 and/or the output conductor 60 becomes greater than a gap between the commutation bar 54 and the input conductor 56 and/or the output conductor 60. For example, the commutation bar 54 may attract a magnetic field generated between the spanner 58 and the input conductor 56 and/or the output conductor 60 after the spanner 58 is retracted.

In the depicted embodiment, the solid-state switching circuit 52 may include a first solid-state switch 70, a second solid-state switch 72, a first voltage suppressor (VS) 74, and a second voltage suppressor 76. In alternative or additional cases, the solid-state switching circuit 52 may include additional solid-state switches, voltage suppressors, and/or other elements. The first solid-state switch 70, the second solid-state switch 72, or both may include any suitable solid state semi-conducting device that may conduct current through solid semiconductor material and may include power metal-oxide-semiconductor field-effect transistors (MOSFETs), insulated-gate bipolar transistors (IGBTs), metal-oxide-semiconductor-controlled thyristors (thyristors), vertical metal oxide semiconductors or V-groove MOSs (VMOSs), laterally-diffused metal-oxide semiconductors (LDMOSs), diodes, or a combination thereof. Additionally, the first voltage suppressor (VS) 74, the second voltage suppressor 76, or both may include any suitable electronic component that may absorb excess energy present when an overvoltage event is present. The voltage suppressors may include a voltage suppression diode, a Zener diode, a metal-oxide varistor (MOV), and the like.

Referring back to FIG. 2, the first solid-state switch 70 may conduct electrical current from the first side 66 of the commutation bar 54 to the second side 68 of the commutation bar 54 when operating in a closed state. For example, a drain of the first solid-state switch 70 may couple to the first side 66 of the commutation bar 54 and a source of the first solid-state switch may couple to a source portion of the second solid-state switch 72 (e.g., the second side 68 of the bar 54 when the second solid-state switch 72 is in closed state).

Moreover, the second solid-state switch 72 may conduct the electrical current from the second side 68 of the bar 54 to the first side 66 of the bar 54 when operating in a closed state. For example, a drain of the second solid-state switch 72 may couple to the second side 68 of the bar 54 and the source of the second solid-state switch 72 may couple to the source portion of the first solid-state switch 70 (e.g., the first side 66 of the bar 54 when the first solid-state switch 70 is in closed state).

In the depicted embodiment, the first voltage suppressor 74 and the second voltage suppressor 76 are coupled in parallel to the first solid-state switch 70 and the second solid-state switch 72, respectively. However, it should be appreciated that in alternative or additional cases, the first voltage suppressor 74 and/or the second voltage suppressor 76 may be coupled to a different node of the solid-state switching circuit 52. The first voltage suppressor 74 and the second voltage suppressor 76 may each suppress at least a portion of an electrical power on the commutation bar 54. For example, the first voltage suppressor 74 and the second voltage suppressor 76 may reduce or remove the electrical power (e.g., electrical energy, electrical charges) on the commutation bar 54 when the first solid-state switch 70, the second solid-state switch 72, or both, are opened.

In some cases, the first voltage suppressor 74 and/or the second voltage suppressor 76 may include circuitry to ground (or otherwise suppress) the electrical power on the commutation bar 54. As such, the first voltage suppressor 74 and/or the second voltage suppressor 76 may discharge the bar 54 based on grounding the electrical power on the bar 54. Accordingly, the solid-state switching circuit 52 may use the first voltage suppressor 74 and/or the second voltage suppressor 76 to reduce or remove at least a portion of electrical power of the one or more electrical arcs on the bar 54.

FIG. 3 depicts the hybrid circuit breaker 14 of FIG. 2 when the actuator 62 is retracting the spanner 58. In some cases, the actuator 62 may receive a control signal form the control system 18 or other suitable device that causes it to retract the spanner 58, thereby inducing electrical arcs 78 when electrical current is flowing through the spanner 58. For example, the electrical arcs 78 are generated as a spanner gap 80 (e.g., air gap) increases between the spanner 58 and the input conductor 56 and the output conductor 60 due to the actuator 62 retracting the spanner 58. Although two electrical arcs 78 are shown with respect to the input conductor 56 and the output conductor 60 in the embodiment of FIG. 3, in other cases, the widening of the spanner gap 80 may generate the electrical arcs 78 on one of the input conductor 56 or the output conductor 60.

In the depicted embodiment, the spanner gap 80 between the spanner 58 and the input conductor 56 may be similar to (e.g., equal to, substantially equal to) the spanner gap 80 between the spanner 58 and the output conductor 60. However, in other cases, such spanner gaps 80 may have different lengths. Moreover, in the depicted embodiment, a bar gap 82 between the first side 66 of the bar 54 and the input conductor 56 may be similar to that between the second side 68 of the bar 54 and the output conductor 60. However, in other cases, such spanner gaps 80 may be different.

In any case, in the depicted embodiment of FIG. 3, the spanner gap 80 may be smaller than the bar gap 82. For example, the spanner 58 is not sufficiently (e.g., completely, more than a threshold) retracted to provide the spanner gap 80 wider than the bar gap 82. As such, the electrical arcs 78 are generated between the spanner 58 and the input conductor 56 and between the spanner 58 and the output conductor 60.

Referring now to the state of the hybrid circuit breaker 14 in FIG. 4, the actuator 62 retracted the spanner 58 a sufficient distance such that the spanner gap 80 is wider than the bar gap 82. As such, the first side 66 and the second side 68 of the bar 54 may receive the electrical arcs 78 by drawing the electrical arcs 78 away from the spanner 58. For example, the first side 66 and the second side 68 of the commutation bar 54 may draw a magnetic field of the electrical arcs 78 generated between the spanner 58 and the input conductor 56 and/or the output conductor 60 based on the closer proximity. Moreover, the first side 66 and the second side 68 of the commutation bar 54 may receive or draw the electrical arcs 78 in a few micro-seconds (μs) (e.g., 1 μs, 2 μs, 3 μs, and so on) or a few milli-seconds (ms) (e.g., 1 ms, 2 ms, 3 ms, and so on) after the electrical arcs 78 are generated.

In the depicted embodiment, the first solid-state switch 70 and the second solid-state switch 72 of the solid-state switching circuit 52 are closed to provide a conductive path for the electrical arcs 78 in the commutation bar 54. Subsequently, the first solid-state switch 70 and the second solid-state switch 72 may open to suppress an electrical power (e.g., electrical energy) of the electrical arcs 78. For example, the first voltage suppressor 74 and/or the second voltage suppressor 76 may discharge the commutation bar 54 after the first solid-state switch 70 and/or the second solid-state switch 72 open, as discussed in more detail below.

With the foregoing in mind, FIG. 5 shows an embodiment of the hybrid circuit breaker 14 after the solid-state switching circuit 52 suppresses electrical power of the electrical arcs 78. In FIG. 5, the first solid-state switch 70 and the second solid-state switch 72 are open to open the circuit available to the electrical arcs 78. In some embodiments, the voltage suppressors 74 and 76 may ground or otherwise discharge the commutation bar 54 after the first solid-state switch and the second solid-state switch 72 are opened. Accordingly, the commutation bar 54 may reduce or prevent adverse effects (e.g., damages, wearing due to heat) of the electrical arcs 78 to the spanner 58 (and/or the hybrid circuit breaker 14) and may increase a lifespan and reliability of the hybrid circuit breaker 14.

In some cases, the first solid-state switch 70 and the second solid-state switch 72 may open after the control system 18 detects electrical charges on the bar 54 higher than a threshold. For example, one or more sensors (e.g., an electrical coil) may provide an indication of the current flow through the commutation bar 54 to the control system 18. Moreover, the control system 18 may provide one or more control signals to open the first solid-state switch 70 and/or the second solid-state switch 72 in response to the current flowing through the commutation bar 54 being above the threshold.

In specific cases, the control system 18 may provide the one or more control signals to open the first solid-state switch 70 or the second solid-state switch 72 based on a direction of the current. In alternative or additional cases, the one or more sensors of the hybrid circuit breaker 14 may provide the one or more control signals directly to the first solid-state switch 70 or the second solid-state switch 72. In any case, the voltage suppressors 74 and 76 may discharge the commutation bar 54 and remove the presence of the electrical arcs 78 from the commutation bar 54.

FIG. 6 is a process 100 performed by the processor 24 to operate the hybrid circuit breaker 14 of FIGS. 2-5 in accordance with embodiments described herein. At the beginning of the process 100, the mechanical switch system 50 may be initially closed. As such, current may flow through the hybrid circuit breaker 14 via the mechanical switch system 50.

At block 102, the processor 24 may receive an indication to open the conductive path of the hybrid circuit breaker 14. For example, the processor 24 may receive one or more control signals from a control system, a monitoring system, or some other supervising device that detects a presence of a fault, an undesirable condition (e.g., overvoltage, overcurrent), or the like. By way of example, the undesirable condition may correspond to a current flow within the hybrid circuit breaker 14 being above a threshold. In some embodiments, one or more sensors (e.g., current sensor, voltage sensor, among other things) of the hybrid circuit breaker 14 may provide a measurement that is associated with the current flow of the hybrid circuit breaker 14.

In any case, after receiving the indication or request to open the mechanical switch system 50, at block 104, the processor 24 may transmit a first signal (or multiple signals) to the actuator 62 to cause the actuator 62 to open the mechanical switch system 50 of the hybrid circuit breaker 14. For example, the processor 24 may transmit the first signal indicative of retracting the arm 64 to the actuator 62. The actuator 62 may then retract the arm 64 in response to receiving the first signal. In alternative or additional cases, one or more sensors of the hybrid circuit breaker 14 may provide the first signal directly to the actuator 62 to extend or retract the arm 64. For example, such sensors may provide the first signal based on detecting a current and/or voltage of the hybrid circuit breaker 14 being higher than a threshold. As discussed above, opening the mechanical switch system 50 may generate one or more electrical arcs between the spanner 58 and the input conductor 56 and/or the output conductor 60 of the mechanical switch system 50. However, the commutation bar 54 may draw (e.g., receive, partially receive) the electrical arcs as the spanner gap 80 grows wider than the bar gap 82.

At block 106, the processor 24 may transmit a second signal (or multiple signals) to one or more solid-state switches of the hybrid circuit breaker 14 to cause the switches to open. For example, the processor 24 may transmit the second signal to the first solid-state switch 70 and/or the second solid-state switch 72.

As mentioned above, the processor 24 may provide the second signal to open the first solid-state switch 70 or the second solid-state switch 72 based on a direction of the current. For example, the processor 24 may provide the second signal to open the first solid-state switch 70 when the current is flowing from the first side 66 to the second side 68 of the commutation bar 54. Moreover, the processor 24 may provide the second signal to open the second solid-state switch 72 when the current is flowing from the second side 68 to the first side 66 of the commutation bar 54.

In alternative or additional embodiments, one or more sensors of the hybrid circuit breaker 14 may provide the second signal directly to the first solid-state switch 70 or the second solid-state switch 72. For example, the hybrid circuit breaker 14 may include a current sensing coil that may provide the second signal (e.g., a triggering signal) based on detecting a current flow higher than a predetermined threshold (e.g., above zero, nonzero) on the bar 54.

In any case, the hybrid circuit breaker 14 may suppress electrical power of the electrical arcs on the commutation bar 54, for example, via the voltage suppressors 74 and/or 76. As such, a lifespan of the hybrid circuit breaker 14 may increase by reducing damages that may be caused by the electrical arcs. Although process blocks of FIG. 6 are described in particular order, it should be appreciated that the processes may be performed at any other viable order. Moreover, it should be appreciated that in different embodiments, the processor 24 may use different process blocks. For example, the processor 24 may use additional process blocks or withdraw one or more of the process blocks discussed herein.

FIGS. 7 and 8 depict heat (or energy) dissipation in the hybrid circuit breaker 14 caused by the electrical arcs 78. In FIGS. 7 and 8, some components of the hybrid circuit breaker 14 are not shown for simplicity. In the depicted embodiments, the spanner 58 is retracted sufficiently such that the spanner gap 80 is wider than (or equally as wide as) the bar gap 82.

In FIG. 7, the commutation bar 54 is receiving at least a portion of the electrical arcs 78 by drawing a magnetic field of the electrical arcs 78, for example, based on plasma physics rules. The commutation bar 54 may draw the electrical arcs 78 away from the spanner 58 based on the close proximity of the first side 66 and the second side 68 of the commutation bar 54 to the input conductor 56 and the output conductor 60. Moreover, in the embodiment of FIG. 7, the solid-state switching circuit 52 is on. Accordingly, the solid-state switches 70 and 72 may be closed to conduct currents in both directions through the solid-state switching circuit 52.

FIG. 7 illustrates an example heat flux map 120 of the heat dissipations when the commutation bar 54 is receiving the electrical arcs 78. As shown, the hybrid circuit breaker 14 may have relatively high heat dissipations when receiving the electrical arcs 78. However, the solid-state switching circuit 52 may reduce energy of the heat dissipations by opening the current path of the commutation bar 54. As discussed above, the first solid-state switch 70, the second solid state switch 72, or both, may receive one or more control signals (e.g., the first signal and the second signal discussed above in blocks 104 and 106 of FIG. 6) to open current path. For example, the solid-state switching circuit 52 may open the current path of the bar 54 in a few micro-seconds (e.g., 1 μs, 2 μs, 3 μs, and so on) or a few milli-seconds (e.g., 1 ms, 2 ms, 3 ms, and so on) after the bar 54 receives the electrical arcs 78.

FIG. 8 illustrates an example heat flux map 122 after the solid-state switching circuit 52 breaks the circuit conducting the electrical arcs 78. For example, the solid-state switching circuit 52 is off based on receiving one or more control signals. As shown, the hybrid circuit breaker 14 may have lower heat dissipations compared to the heat flux map 120 of FIG. 7. The solid-state switching circuit 52 may reduce energy of the heat flux map 120 by opening the current path of the bar 54 and suppressing the electrical power of the electrical arcs 78. As discussed above, the voltage suppressors 74 and/or 76 may suppress the electrical power of the electrical arcs 78 when the first solid-state switch 70 and the second-solid-state switch are open.

Accordingly, the hybrid circuit breaker 14 may include the mechanical switch system and the solid-state switching circuit 52 positioned in parallel to reduce one or more adverse effects of the electrical arcs 78. As shown in FIGS. 7 and 8, incorporating the solid-state switching circuit 52 with the hybrid circuit breaker 14 may decrease a total amount of heat in the hybrid circuit breaker 14 by dissipating the electrical power of the electrical arcs 78. Moreover, the described implementations of the solid-state switching circuit 52 may reduce a footprint of a circuit breaker with heat dissipation capabilities. Accordingly, the described implementations of the solid-state switching circuit 52 with a circuit breaker may also reduce manufacturing and user costs based at least in part on increased reliability of the circuit breaker.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A circuit breaker, comprising:
a spanner configured to move between a first position and a second position, wherein the first position corresponds to an input conductor being coupled to an output conductor via the spanner, and wherein the second position corresponds to the input conductor being uncoupled from the output conductor via the spanner; and
a commutation bar comprising solid-state switching circuitry, wherein the commutation bar is positioned a first distance away from the input conductor, wherein the commutation bar is configured to receive an arc current as the spanner moves from the first position to the second position, and wherein the solid-state switching circuitry is configured to turn off after the spanner moves from the first position to the second position.

2. The circuit breaker of claim 1, comprising a processor configured to receive data associated with the arc current, wherein the processor is configured to send a signal to the solid-state switching circuitry to turn off in response to receiving the data.

3. The circuit breaker of claim 1, wherein a second distance between the spanner and the input conductor when the spanner is in the first position is different from the first distance between the commutation bar and the input conductor when the spanner is in the first position.

4. The circuit breaker of claim 3, wherein the first distance is less than the second distance.

5. The circuit breaker of claim 1, wherein a second distance between the spanner and the input conductor when the spanner is in the second position is greater than the first distance between the commutation bar and the input conductor when the spanner is in the second position.

6. The circuit breaker of claim 1, comprising a voltage suppressor circuit configured to electrically couple to the solid-state switching circuitry in parallel.

7. The circuit breaker of claim 1, comprising an actuator configured to move the spanner between the first position and the second position.

8. The circuit breaker of claim 1, wherein the solid-state switching circuitry comprises at least one solid-state device.

9. The circuit breaker of claim 1, wherein the solid-state switching circuitry comprises a first solid-state device comprising a first source portion coupled to a second source portion of a second solid-state device.

10. The circuit breaker of claim 1, wherein the solid-state switching circuitry comprises a plurality of power metal-oxide-semiconductor field-effect transistors, insulated-gate bipolar transistors, metal-oxide-semiconductor-controlled thyristors, vertical metal oxide semiconductors or V-groove MOSs, laterally-diffused metal-oxide semiconductors, diodes, or a combination thereof.

11. A method, comprising:
receiving, by a processor, an indication to open a conductive path of a circuit breaker, wherein the conductive path comprises an input conductor, an output conductor, and a spanner;
transmitting, by the processor, a first signal to a mechanical switch system of the circuit breaker in response to receiving the indication, wherein the mechanical switch system is configured to move the spanner in response to receiving the first signal, and wherein the spanner is positioned a first distance away from the input conductor and the output conductor after the spanner is moved; and
transmitting, by the processor, a second signal to one or more solid-state switches of the circuit breaker, wherein the one or more solid-state switches are configured to open in response to receiving the second signal, wherein the one or more solid-state switches are coupled to a commutation bar separate from the spanner and positioned a second distance away from the input conductor.

12. The method of claim 11, wherein transmitting the first signal to the mechanical switch system comprises transmitting the first signal to an actuator or solenoid configured to retract the spanner of the mechanical switch system away from the input conductor.

13. The method of claim 12, wherein the second signal is transmitted in response to detecting an electrical arc between the input conductor and the spanner as the spanner is retracting, wherein the commutation bar is configured to receive at least a portion of the electrical arc.

14. The method of claim 11, comprising receiving, by the processor, an indication of an electrical current being present on the commutation bar from a sensor before transmitting the second signal, wherein the electrical current is associated with an electrical arc generated between the spanner and the input conductor when opening the mechanical switch system.

15. The method of claim 11, wherein the commutation bar is configured to receive at least a portion of an electrical arc generated when opening the mechanical switch system based on the first distance being larger than the second distance.

16. The method of claim 11, comprising transmitting, by the processor, the second signal to a first solid-state switch and a second solid-state switch, wherein the second signal is configured to open a current path of the commutation bar, wherein a first source portion of the first solid-state switch is coupled to a first source portion of the second solid-state switch.

17. A tangible, non-transitory, machine-readable medium, comprising machine-readable instructions that, when executed by a processor, cause the processor to perform actions comprising:

receiving an indication to open a conductive path of a circuit breaker, wherein the conductive path comprises an input conductor, an output conductor, and a spanner;

transmitting a first signal to a mechanical switch system of the circuit breaker in response to receiving the indication, wherein the mechanical switch system is configured to move the spanner in response to receiving the first signal, and wherein the spanner is positioned a first distance away from the input conductor and the output conductor after the spanner is moved; and transmitting a second signal to one or more solid-state switches of the circuit breaker, wherein the one or more solid-state switches are configured to open in response to receiving the second signal, wherein the one or more solid-state switches are coupled to a commutation bar separate from the spanner, and wherein the commutation bar is positioned a second distance away from the input conductor, wherein the first distance is different from the second distance.

18. The tangible, non-transitory, machine-readable medium of claim 17, wherein the machine-readable instructions that causes the processor to transmit the first signal to the mechanical switch system comprises transmitting the first signal to an actuator configured to retract the spanner of the mechanical switch system away from the input conductor.

19. The tangible, non-transitory, machine-readable medium of claim 18, wherein the machine-readable instructions causes the processor to transmit the second signal in response to receiving an indication of an electrical arc present between the input conductor and the spanner as the spanner is retracting.

20. The tangible, non-transitory, machine-readable medium of claim 19, wherein the indication of the electrical arc is received from a sensor.

* * * * *